(12) United States Patent
Takahashi

(10) Patent No.: US 7,911,007 B2
(45) Date of Patent: Mar. 22, 2011

(54) SEMICONDUCTOR DEVICE AND METHOD OF MANUFACTURING THE SAME

(75) Inventor: Kensuke Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 125 days.

(21) Appl. No.: 12/227,974

(22) PCT Filed: May 18, 2007

(86) PCT No.: PCT/JP2007/060255
§ 371 (c)(1),
(2), (4) Date: Dec. 4, 2008

(87) PCT Pub. No.: WO2007/142010
PCT Pub. Date: Dec. 13, 2007

(65) Prior Publication Data
US 2009/0166748 A1    Jul. 2, 2009

(30) Foreign Application Priority Data
Jun. 9, 2006   (JP) ................................ 2006-161168

(51) Int. Cl.
*H01L 21/04* (2006.01)
(52) U.S. Cl. ................................ 257/384; 257/E29.156
(58) Field of Classification Search .................. 257/409, 257/384, 755, E29.156
See application file for complete search history.

(56) References Cited

U.S. PATENT DOCUMENTS
5,986,286 A * 11/1999 Yamazaki et al. ............... 257/65
6,605,513 B2 * 8/2003 Paton et al. .................... 438/299
7,638,433 B2 * 12/2009 Yun et al. ....................... 438/682
2005/0070062 A1    3/2005 Visokay et al.
2005/0199963 A1 * 9/2005 Aoyama ......................... 257/369

FOREIGN PATENT DOCUMENTS
| JP | 2003-258121 | 9/2003 |
| JP | 2005-129551 | 5/2005 |
| WO | WO 2006/001271 | 1/2006 |
| WO | WO 2007/060797 | 5/2007 |

OTHER PUBLICATIONS

Lauwer, A., et al., "CMOS Integration of Dual Work Function Phase Controlled Ni FUSI with Simultaneous Silicidation of NMOS (NiSi) and PMOS (Ni-rich silicide) Gates on HfSiON", IEDM Techinal Digest, 2005, pp. 661-664.

Takahashi, Kensuke, et al., "Dual Workfunction Ni-Silicide/HfSiON Gate Stacks by Phase-Controlled FullSilicidation (PC-FUSI) Technique for 45nm-node LSTP and LOP Devices", IEDM Technical Digest, 2004, p. 91-94.

(Continued)

*Primary Examiner* — W. David Coleman
(74) *Attorney, Agent, or Firm* — McGinn IP Law Group, PLLC

(57) ABSTRACT

A semiconductor device including a silicon substrate and a field effect transistor including a gate insulating film on the silicon substrate, a gate electrode on the gate insulating film, and source/drain regions formed in the substrate on opposite sides of the gate electrode, wherein the gate electrode includes a silicide layer containing an $Ni_3Si$ crystal phase, at least in a portion of the gate electrode, the portion including a lower surface thereof, and the transistor includes an adhesion layer containing a metal oxide component, between the gate insulating film and the gate electrode.

10 Claims, 10 Drawing Sheets

OTHER PUBLICATIONS

Ranade, P., et al., "High Performance 35nm Lgate CMOS Transistors Featuring NiSi Metal Cate (FUSI), Uniaxial Strained Silicon Channels and 1.2nm Gate Oxide", IEDM, 2005, pp. 227-230.

Terai, Masayuki, et al., Highly Reliable HfSiON CMOSFET with Phase Controlled NiSi (NFET) and Ni3Si (PFET) FUSI Gatee Electrode, Symposium on VLSI Technology Digest fo Technical Papers, 2005, pp. 68-69.

Kakumu, Hasakazu, et al., "Lightly Impurity Doped (LD) Mo Silicide Gate Technology", IEDM, 1985, pp. 415-418.

Kedzierski, Jakub, et al., "Metal-gate FinFET and fully-depleted SOI devices using total gate silicidation", IEDM, 2002, pp. 247-250.

Vogel, Eric, et al., "36th IEEE Semiconductor Interface Specialists Conference", SISC, 2005, P-1, pp. 23-24.

Kedziersaki, Jakub, et al., "Threshold voltage control in NiSi-gated MOSFETs through silicidation induced impurity segregation (SIIS)", IEDM, 2003, pp. 315-318.

Lee, JaeHoon, et al., "Tunable Work Function Dual Metal Gate Technology for Bulk and Non-Bulk CMOS", IEDM Technical Digest, 2002, pp. 359-362.

Kittl, J.A., et al., "Work Function of Ni Silicide Phases on HfSiON and SiO2: NiSi, Ni2Si, Ni31Si12, and Ni3Si Fully Silicided Gates", IEEE Electron Device Letters, vol. 27, No. 1, Jan. 2006, pp. 34-36.

Aime, D., et al., "Work function tuning, through dopant scanning and related effects in Ni fully silicided gate for sub-45nm nodes CMOS", IEDM Technical Digest, 2004, pp. 87-90.

* cited by examiner

N-type MOSFET   P-type MOSFET

N-type MOSFET   P-type MOSFET

SEMICONDUCTOR DEVICE AND METHOD OF MANUFACTURING THE SAME

TECHNICAL FIELD

The present invention relates to a semiconductor device and a method of manufacturing the semiconductor device, and in particular, to a technique for a MOS field effect transistor (MOSFET: Metal Oxide Semiconductor Field Effect Transistor) including a gate electrode formed of metal silicide.

BACKGROUND ART

A problem with recently developed advanced CMOS (complementary MOS) devices with increasingly miniaturized transistors is degradation of a driving current caused by depletion of a gate electrode. Thus, to improve driving capability, efforts have been made to develop a technique using a metal-based material instead of polycrystalline silicon, which is conventionally used, that is, to develop what is called a metal gate technique.

On the other hand, the miniaturized transistor has resulted in a thinned gate insulating film, disadvantageously increasing a gate leakage current. Thus, in order to reduce power consumption, attempts have been made to use a high-dielectric-constant material (high-k material) for the gate insulating film to increase the physical film thickness thereof, thus reducing the gate leakage current.

Pure metal, metal nitride, a silicide material, or the like has been examined as a material for a metal gate electrode. In any case, (1) the gate insulating film needs to be prevented from being degraded when the metal gate electrode is formed, and (2) threshold voltages (Vth) for an N-type MOSFET and a P-type MOSFET need to be able to be set to proper values.

As means for achieving this, a method of controlling the Vth of the transistor has been proposed which method produces the gate electrodes of the N- and P-type MOSFETs using different metals or alloys with respective optimum work functions (this method is called a dual metal gate technique).

For example, Non-Patent Document 1 (International Electron Device Meeting Technical Digest 2002, p. 359) states that the work functions of a Ta electrode and a Ru electrode formed on $SiO_2$ are 4.15 eV and 4.95 eV, respectively and that work function modulation of 0.8 eV can be performed between the two electrodes.

However, owing to the need to form metal layers made up of dissimilar metals or alloys with different work functions on a substrate, the dual metal gate technique involves a process of etching the metal layer deposited on the gate insulating film of one of the P- and N-type MOSFETs. Thus, disadvantageously, the etching degrades the quality of the gate insulating film, thus deteriorating the performance and reliability of elements.

On the other hand, Non-Patent Document 2 (International Electron Device Meeting Technical Digest 2004, p. 91) and Patent Document 1 (WO 2006/001271) describe a technique for an Ni full silicide gate electrode obtained by fully silicidng a gate pattern made up of polycrystalline silicon, with nickel (Ni). The technique carries out a high-temperature heat treatment to activate impurities in source/drain diffusion regions of a CMOS and then carries out a silicide process on a gate pattern made up of polycrystalline silicon for silicidation. Thus, the technique matches a conventional CMOS process well. The technique also enables gate electrodes made up of silicides with different work functions to be produced without the need for a process of etching away films deposited on the gate insulating film as in the case of the dual metal gate technique. Thus, possible damage to the gate insulating film can be prevented.

Specifically, Non-Patent Document 2 and Patent Document 1 describe that in production of a MOSFET including an HfSiON high-dielectric-constant film as a gate insulating film and an Ni full silicide electrode as a gate electrode, a wide range of effective work functions can be controlled by utilizing formation of a crystal phase to control the composition of nickel silicide. In particular, the documents describe that a Vth of ±0.3 V can be obtained by utilizing formation of an $Ni_3Si$ phase, an NiSi phase, and an $NiSi_2$ phase.

In addition, as a technique for controlling the threshold value, a technique using a silicide containing impurities as a gate electrode has been proposed.

Patent Document 2 (US 2005/0070062-A) discloses a semiconductor device which uses a metal silicide with p-type impurities added thereto as a gate electrode for a P-type MOSFET and a metal silicide with n-type impurities added thereto as a gate electrode for an N-type MOSFET.

Patent Document 3 (JP 2005-129551-A) describes that desired work functions for a p-type MOSFET and an N-type MOSFET are obtained by using a gate insulating film made up of silicon oxide and a gate electrode containing 40 to 70 atom percents of Ni composition (Ni/[Ni+Si]) and p-type impurities, and a gate insulating film made up of silicon oxide and a gate electrode containing 30 to 60 atom percents of Ni composition and n-type impurities, respectively.

A technique of using an Ni full silicide gate electrode formed entirely of nickel silicide normally uses nickel monosilicide (NiSi) with a low resistance as a gate material. However, if a fine gate electrode and a relatively large gate electrode are simultaneously formed, silicidation disadvantageously progresses unevenly to form crystal phases with compositions varying depending on gate sizes. This is probably because the amount of nickel diffusing from a nickel film formed on a polycrystalline silicon layer making up a gate pattern to the polycrystalline silicon layer, particularly the amount of nickel diffusing in a lateral direction (a planar direction of a substrate), varies depending on the gate size. Furthermore, even when the gate electrodes have the same size, the speed of the silicidation is affected depending on the type of impurities added to the polycrystalline silicon layer. This prevents sufficient silicidation, with polycrystalline silicon remaining in the electrodes.

This phenomenon is probably because the NiSi in the nickel silicide is not in the most stable phase and because various crystal phases such as an $NiSi_2$ phase, an $Ni_2Si$ phase, and an $Ni_3Si$ phase are likely to be formed. A possible variation in silicide composition varies the amount of impurities in the vicinity of an interface between the gate electrode and the gate insulating film. As a result, the threshold value varies. If the polycrystalline silicon remains in the electrodes without being silicided, original metal gate effects cannot be exerted.

To solve this problem, a technique of carrying out a two-level heat treatment for silicidation has been proposed. Such a technique is described in Non-Patent Document 3 (International Electron Devices Meeting Technical Digest, 2004, p. 87) and Non-Patent Document 4 (International Electron Devices Meeting Technical Digest, 2005, p. 661). For example, a first heat treatment is carried out to silicide polycrystalline silicon, and the silicidation is stopped before completion (so as to leave a polycrystalline silicon portion) to form a nickel-rich silicide such as $Ni_2Si$. Then, surplus Ni is removed, and a second heat treatment is carried out to silicide the remaining polycrystalline silicon to form NiSi. This enables avoidance of lateral feeding of an excessive amount of Ni to fine patterns.

However, even with this technique, when miniaturization progresses to reduce the height particularly of the gate electrode, process margins decrease to make process control difficult. Then, the amount of Ni supplied to the polycrystalline silicon varies. In particular, formation of the nickel-rich silicide during the first heat treatment of the technique is likely to be affected by an insignificant temperature distribution on a wafer. Furthermore, the first heat treatment results in significant roughness reflecting grain boundaries at the interface between the silicide and the polycrystalline silicon. This makes control of the amount of Ni supplied to the polycrystalline silicon difficult.

DISCLOSURE OF THE INVENTION

In view of the above background art, an object of the present invention is to provide a reliable high-performance semiconductor device that enables a possible variation in element performance to be inhibited, as well as a method of manufacturing the semiconductor device.

The present invention provides the following embodiments of a semiconductor device and a method of manufacturing the semiconductor device.

(1) A semiconductor device including:

a silicon substrate and a field effect transistor including a gate insulating film on the silicon substrate, a gate electrode on the gate insulating film, and source/drain regions formed in the substrate on opposite sides of the gate electrode, wherein the gate electrode includes a silicide layer containing an $Ni_3Si$ crystal phase, at least in a portion of the gate electrode, the portion including a lower surface thereof, and the transistor includes an adhesion layer containing a metal oxide component, between the gate insulating film and the gate electrode.

(2) The semiconductor device as described in item (1), wherein the gate insulating film includes a silicon oxide film or a silicon oxynitride film at least in a portion of the gate insulating film, the portion including an upper surface thereof, and the silicide layer containing the $Ni_3Si$ crystal phase contains an impurity element.

(3) A semiconductor device including:

a silicon substrate;

a P type channel field effect transistor including a first gate insulating film on the silicon substrate, a first gate electrode on the first gate insulating film, and source/drain regions formed in the substrate on opposite sides of the first gate electrode; and an N type channel field effect transistor including a second gate insulating film on the silicon substrate, a second gate electrode on the second gate insulating film, and source/drain regions formed in the substrate on opposite sides of the second gate electrode, wherein in the P type channel field effect transistor, the first gate insulating film includes a silicide oxide layer or a silicon oxynitride layer at least in a portion of the first gate insulating film, the portion including an upper surface thereof, the first gate electrode includes a silicide layer containing a first-conductivity-type impurity element and an $Ni_3Si$ crystal phase, at least in a portion of the gate electrode, the portion including a lower surface thereof, and the P type channel field effect transistor includes an adhesion layer containing a metal oxide component, between the first gate insulating film and the first gate electrode, and in the N type channel field effect transistor, the second gate insulating film includes a silicide oxide layer or a silicon oxynitride layer at least in a portion of the second gate insulating film, the portion including an upper surface thereof, the second gate electrode includes a silicide layer containing a second conductivity type impurity element and an $Ni_3Si$ crystal phase, at least in a portion of the gate electrode, the portion including a lower surface thereof, and the N type channel field effect transistor includes an adhesion layer containing a metal oxide component, between the second gate insulating film and the second gate electrode.

(4) The semiconductor device as described in any one of items (1) to (3), wherein an oxide component of the adhesion layer is a metal oxide selected from the group consisting of Hf, Ta, Zr, La, Ti, Y, and Al.

(5) The semiconductor device as described in any one of items (1) to (4), wherein as the adhesion layer, a metal oxide of 0.01 to 0.1 mL (monolayer) in terms of molecular layers is formed.

(6) The semiconductor device as described in any one of items (1) to (5), wherein on the silicide layer containing the $Ni_3Si$ crystal phase, a low resistance layer with a lower resistance than the silicide layer is provided.

(7) The semiconductor device as described in item (6), wherein the low resistance layer is a silicide layer containing a nickel monosilicide crystal phase.

(8) The semiconductor device as described in any one of items (1) to (7), wherein the silicide layer containing the $Ni_3Si$ crystal phase is formed of a silicide expressed by a composition formula $Ni_xSi_{1-x}$ (0.6<x<0.9).

(9) A method of manufacturing the semiconductor device as described in item (1), the method including:

forming, on a silicon substrate, a gate insulating film including a silicon oxide film or a silicon oxynitride film on a uppermost surface side;

forming an adhesion layer on the gate insulating film;

forming a polycrystalline silicon film on the gate insulating film with the adhesion layer formed thereon;

forming a cap film on the polycrystalline silicon film;

forming a gate pattern of the polycrystalline silicon film including the cap film on an upper surface thereof;

forming source/drain regions in the substrate on opposite sides of the gate pattern;

forming an interlayer insulating film all over a resulting surface;

removing a upper surface portion of the interlayer insulating film and the cap film to expose the polycrystalline silicon making up the gate pattern;

forming a nickel film all over a resulting surface; and siliciding the polycrystalline silicon under the nickel film by heat treatment to form a silicide layer containing an $Ni_3Si$ crystal phase.

(10) The method of manufacturing the semiconductor device as described in item (9), further including adding an impurity element into the polycrystalline silicon film.

(11) The method of manufacturing the semiconductor device as described in item (9) or (10), further including:

after forming the silicide layer containing the $Ni_3Si$ crystal phase, forming a silicon film all over a resulting surface; and diffusing nickel from the silicide layer into the silicon film by heat treatment to form a low resistance silicide layer containing a nickel monosilicide crystal phase.

(12) A method of manufacturing the semiconductor device as described in item (3), the method including:

preparing a semiconductor device including a p-type active region and an n-type active region;

forming, on the silicon substrate, a gate insulating film including a silicon oxide film or a silicon oxynitride film on a uppermost surface side;

forming an adhesion layer on the gate insulating film;

forming a polycrystalline silicon film on the gate insulating film with the adhesion layer formed thereon;

masking the polycrystalline silicon film on one of the active regions and adding a first-conductivity-type impurity element to the polycrystalline silicon film on the other active region;

masking the polycrystalline silicon film on the latter active region and adding a second-conductivity-type impurity element to the polycrystalline silicon film on the former active region;

forming a cap film on the polycrystalline silicon film;

forming a gate pattern of the polycrystalline silicon film including the cap film on an upper surface thereof;

masking one of the active regions and forming source/drain regions in the substrate on opposite sides of the gate pattern on the other active region;

masking the latter active regions and forming source/drain regions in the substrate on opposite sides of the gate pattern on the former active region;

forming an interlayer insulating film all over a resulting surface;

removing a upper surface portion of the interlayer insulating film and the cap film to expose the polycrystalline silicon making up the gate pattern;

forming a nickel film all over a resulting surface; and siliciding the polycrystalline silicon under the nickel film by heat treatment to form a silicide layer containing an $Ni_3Si$ crystal phase.

(13) The method of manufacturing the semiconductor device as described in item (12), further including:

after forming the silicide layer containing the $Ni_3Si$ crystal phase, forming a silicon film all over a resulting surface; and diffusing nickel from the silicide layer into the silicon film by heat treatment to form a low resistance silicide layer containing a nickel monosilicide crystal phase.

In the specification, an "effective work function" of the gate electrode is generally determined from a flat band voltage obtained by CV measurement and is affected by the original work function of the gate electrode, fixed charges in the insulating film, dipoles formed at interfaces, Fermi level pinning, and the like. The "effective work function" is distinguished from the original "work function" of a material making up the gate electrode.

The present invention can provide a reliable high-performance semiconductor device that inhibits a variation in element performance, as well as a method of manufacturing the semiconductor device.

According to the present invention, in particular, the silicide layer containing the $Ni_3Si$ phase is provided in at least the lowermost portion of the gate electrode. Thus, a silicide of a uniform composition can be formed, allowing provision of a semiconductor device with a possible variation in element performance inhibited. Furthermore, according to the present invention, the adhesion layer is provided between the gate electrode and the gate insulating film. Thus, the gate electrode adheres sufficiently to the gate insulating film, allowing a reliable semiconductor device to be provided.

Moreover, according to the present invention, the low resistance layer is provided in an upper layer portion of the gate electrode, the low resistance layer having a lower resistance than the silicide layer containing the $Ni_3Si$ phase provided in the lower layer portion of the gate electrode. Thus, the low resistance layer reduces the wiring resistance of the gate electrode and the contact resistance.

BEST MODE FOR CARRYING OUT THE INVENTION

The present invention is suitable for a MOS field effect transistor (hereinafter referred to as a "MOSFET") with a gate electrode formed of metal silicide, particularly a semiconductor device including a P type channel field effect transistor (hereinafter referred to as a "P-type MOSFET") and an N type channel field effect transistor (hereinafter referred to as an "N-type MOSFET"), for example, a semiconductor device with a complementary MOS (hereinafter referred to as a "CMOS").

Figure 1:
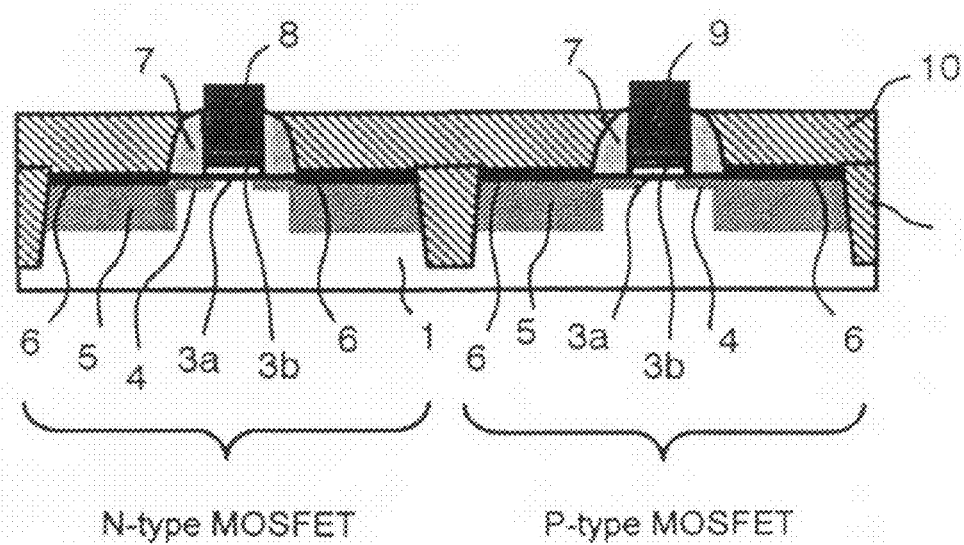
FIG. 1 is a schematic sectional view showing a first exemplary embodiment of a semiconductor device according to the present invention.
Figure 2:
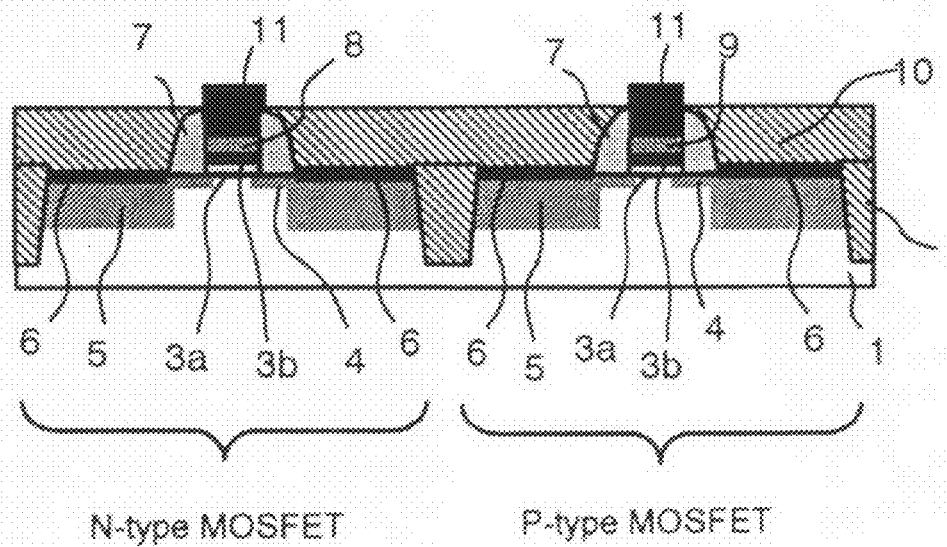
FIG. 2 is a schematic sectional view showing a second exemplary embodiment of a semiconductor device according to the present invention.

FIGS. 1 and 2 show schematic sectional views illustrating a first exemplary embodiment and a second exemplary embodiment, respectively, of a semiconductor device according to the present invention. In the figures, reference numerals 1, 2, and 3a denote a silicon substrate, an isolation region, and a gate insulating film, respectively. Reference numerals 3b, 4, and 5 denote an adhesion layer, an extension diffusion region, and a source/drain diffusion region, respectively. Reference numerals 6, 7, and 8 denote a silicide layer, a gate sidewall, and an impurities-containing $Ni_3Si$ electrode, respectively. Reference numerals 9, 10, and 11 denote an impurities-containing $Ni_3Si$ electrode, an interlayer insulating film, and a low resistance layer, respectively.

Each of the semiconductor devices according to the first and second exemplary embodiments includes a P-type MOSFET and an N-type MOSFET. In the semiconductor devices, a silicon oxide film or a silicon oxynitride film is used as a gate insulating film. An impurities-containing $Ni_3Si$ electrode is used as a gate electrode. The gate electrode of the P-type MOSFET contains p-type impurities such as boron (B). The gate electrode of the N-type MOSFET contains n-type impurities such as phosphorous (P). A predetermined threshold value is set for each of the transistors depending on the type and concentration of the impurities.

A feature of the present invention is that a silicide layer containing an $Ni_3Si$ crystal phase (hereinafter appropriately referred to as an "$Ni_3Si$ layer") is provided at least in a region of the gate electrode including a lower surface thereof (at least in the lowermost layer portion) and the adhesion layer is provided between the gate electrode and the gate insulating film. In the exemplary embodiment shown in FIG. 1, the whole gate electrode is formed of the silicide layer containing the $Ni_3Si$ crystal phase ($Ni_3Si$ electrodes 8 and 9). However, as in the case of the second exemplary embodiment, shown in FIG. 2, the low resistance layer (low resistance silicide layer 11) can be provided in an upper layer portion of the gate electrode, the low resistance layer having a lower resistance than the lower silicide layer ($Ni_3Si$ electrodes 8 and 9) of the gate electrode.

The $Ni_3Si$ layer at least in the lowermost portion of the gate electrode enables a possible variation in threshold value to be inhibited, allowing provision of a semiconductor device with excellent element performance. The $Ni_3Si$ crystal phase is a crystal phase of nickel silicide that can be most stably formed. For example, by performing silicidation at a temperature of at least 350° C. or more for a required time or more using a required amount or more of supplied nickel, a silicide of a given composition can be formed without depending on a gate pattern size or the amount of impurities in polycrystalline silicon. Consequently, the concentration of impurities in the vicinity of an interface between the gate electrode and the gate insulating film is stable at a predetermined value. A possible variation in threshold value can thus be inhibited.

The threshold value in the first and second exemplary embodiments is controlled based on the type and concentration of impurities added to the gate electrode. In this case, the $Ni_3Si$ layer is used in the gate electrodes (at least the lowermost layer portion) of both the P- and N-type MOSFETs. A silicon oxide film or a silicon oxynitride film is used in the gate insulating film. When the gate insulating film has a multilayer structure, the silicon oxide film or silicon oxynitride film is preferably provided in the uppermost layer portion of the gate insulating film. The effective work function of nickel silicide on the silicon oxide film or silicon oxynitride film is unlikely to be affected by the composition of the silicide crystal phase and exhibits an almost constant value. Thus, the threshold value can be easily controlled by adding impurities to the silicide.

According to the present invention, the adhesion layer is provided between the gate electrode and the gate insulating film to improve the adhesion between the gate electrode and the gate insulating film. As a result, a reliable semiconductor device can be provided. Manufacturing yield can also be improved.

Figure 3:
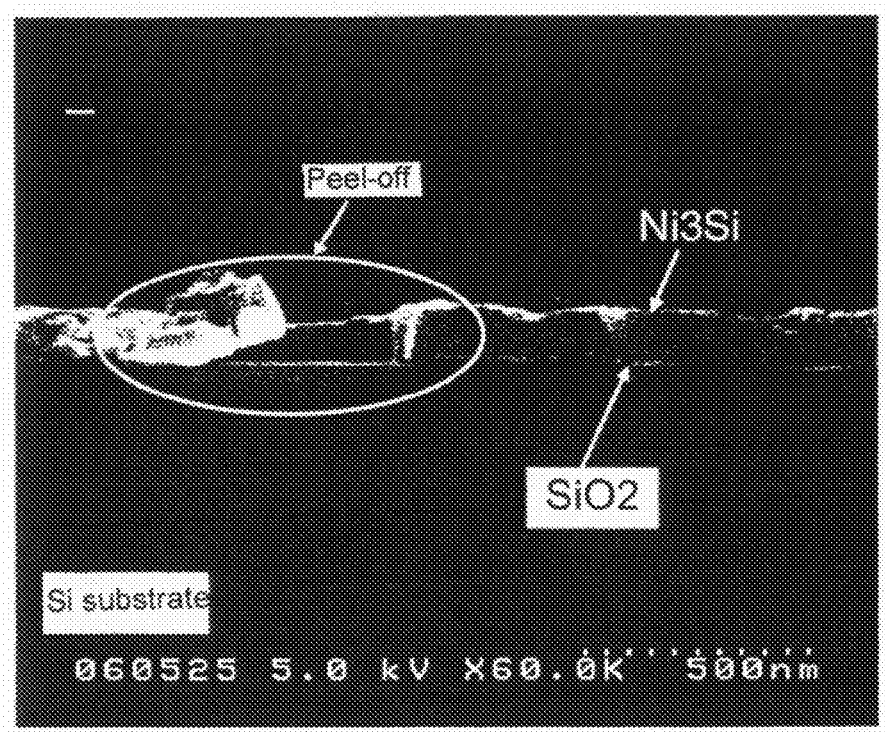
FIG. 3 is a sectional photograph showing a condition of a silicide layer on a silicon oxide film (no adhesion layer)
Figure 4:
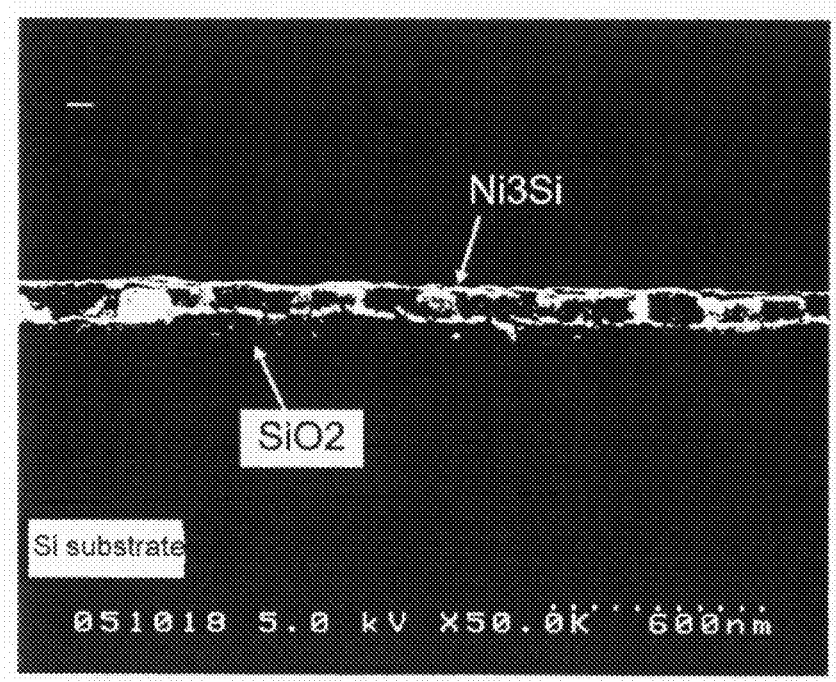
FIG. 4 is a sectional photograph showing a condition of a silicide layer on a silicon oxide film (an adhesion layer provided)

FIGS. 3 and 4 show sectional photographs of a nickel silicide layer formed on a silicon oxide film. FIG. 3 shows an example in which the adhesion layer is not provided between the silicon oxide film and the silicide layer. FIG. 4 shows an example in which the adhesion layer is provided between the silicon oxide film and the silicide layer.

In the case shown in FIG. 3, a silicon oxide film (thickness: 3 nm) was formed on the silicon substrate by thermal oxidation. An $Ni_3Si$ layer (thickness: 120 nm) was formed on the oxide film as follows. After the formation of the silicon oxide film, a polycrystalline silicon film of thickness 60 nm was deposited by a CVD (Chemical Vapor Deposition) method. The polycrystalline silicon film was then subjected to an annealing process under the same conditions as those for activating annealing of source/drain regions of a normal CMOS process. Then, a nickel film (thickness: 100 nm) was formed all over the resulting surface to allow the polycrystalline silicon film to be silicided. Then, heat treatment was carried out to form $Ni_3Si$. As heat treatment conditions, temperature was set to 400° C., and heat treatment time was set to 5 minutes. Then, surplus Ni was removed by wet etching using a mixed solution of sulfuric acid and hydrogen peroxide. The above-described process was carried out to form a structure shown in FIG. 3.

In the case shown in FIG. 4, a silicon oxide film (thickness: 3 nm) was formed on the silicon substrate by thermal oxidation. An adhesion layer (0.06 ML) and an $Ni_3Si$ layer (thickness: 120 nm) were formed on the oxide film as follows. After the formation of the silicon oxide film, hafnium silicon oxide was deposited on the silicon oxide film by an atomic layer position (ALD) method. As deposition conditions, a substrate temperature was set to 300° C., and tetra diethyl amino hafnium ($Hf[(C_2H_6)_2N]_4$) and tris dimethyl amino silicon ($HSi[N(CH_3)_2]_3$) were used as a deposition material. First, $H_2O$ was fed onto the silicon oxide film as an oxidation gas and then supplied at a flow rate of 20 sccm (standard $cm^3$/min) for 50 seconds. Then, the silicon material gas was supplied at 10 sccm. Then, the Hf material gas was supplied for 10 seconds by bubbling a nitrogen carrier gas at a flow rate of 20 sccm. Then, $H_2O$ was supplied again in order to oxidize an Hf and silicon element surface. At this time, the amount of hafnium oxide component (Hf—O component) contained in the hafnium silicon oxide deposited on the silicon oxide film was 0.03 mL in terms of molecular layers. Then, a polycrystalline silicon film of thickness 60 nm was deposited by the CVD (Chemical Vapor Deposition) method. The polycrystalline silicon film was then subjected to the annealing process under the same conditions as those for activating annealing of source/drain regions of the normal CMOS process. Then, a nickel film (thickness: 100 nm) was formed all over the resulting surface to allow the polycrystalline silicon film to be silicided. Then, heat treatment was carried out to form $Ni_3Si$. For heat treatment conditions, the temperature was set to 400° C., and the heat treatment time was set to 5 minutes. Then, surplus Ni was removed by wet etching using a mixed solution of sulfuric acid and hydrogen peroxide. The above-described process was carried out to form a structure shown in FIG. 4.

The photographs in FIGS. 3 and 4, showing sections of the silicide layers formed on the substrates, were taken using a scanning electron microscope (SEM) (trade mark: S5000 manufactured by Hitachi High-Technologies Corporation).

As is apparent from the figures, in the example shown in FIG. 3, in which the adhesion layer was not provided, the silicide layer ($Ni_3Si$ layer) peeled off. However, in the example shown in FIG. 4, in which the adhesive layer was provided, the possible peel-off was prevented, thus improving the adhesion between the silicon oxide film and the silicide layer ($Ni_3Si$ layer). In connection with the adhesion between the silicon oxide film and the silicide layer ($Ni_3Si$ layer), even without the adhesion layer, the possible peel-off was prevented when an NiSi layer with a low nickel composition was formed. This indicates that the peel-off phenomenon is significant when the $Ni_3Si$ layer with a high Ni composition is formed.

The adhesion layer in the present invention is a region provided at an interface between a gate oxide film and the gate electrode, the region containing a metal oxide component. In the adhesion layer, the coverage of the metal oxide component at the interface in terms of molecular layers is preferably at least 0.01 ML (monolayer) and at most 0.1 ML, more preferably at least 0.03 ML and at most 0.07 ML. Furthermore, the abundance of the metal oxide component at the interface in terms of metal atoms is preferably at least 1E13 $cm^{-2}$ and at most 1E14 $cm^{-2}$, more preferably at least 3E13 $cm^{-2}$ and at most $7E13^{-2}$.

If the metal oxide component is formed over an excessively large area in the adhesion layer or an excessively large amount of metal oxide component is present in the adhesion layer, a Fermi level pinning phenomenon occurs to make control of the threshold value based on impurities difficult. In addition, physical film thickness increases to increase the equivalent oxide film thickness (EOT) of the gate insulating film and the like, thus degrading the driving capability of the transistor. On the other hand, if the metal oxide component is formed over an excessively small area in the adhesion layer or the amount of the metal oxide component is excessively small in the adhesion layer, sufficient adhesion is difficult to achieve between the gate insulating film and the gate electrode.

Examples of the metal in the metal oxide in the adhesion layer include Hf, Ta, Zr, La, Ti, Y, and Al. In particular, the metal is preferably selected from Hf, Zr, La, and Ta. Examples of the metal oxide in the adhesion layer include $HfO_2$, HfSiO, HfSiON, $TaO_2$, TaSiO, TaSiON, $ZrO_2$, ZrSiO, ZrSiON, $La_2O_3$, LaSiO, LaSiON, $TiO_2$, TiSiO, TiSiON, $Y_2O_3$, YSiO, YSiON, $Al_2O_3$, and AlON. In particular, the metal oxide is preferably selected from $HfO_2$, HfSiO, and HfSiON.

In the present invention, the thickness of the $Ni_3Si$ layer, making up the gate electrode, needs to have at least a value that ensures an effective work function originally offered by the impurities-containing $Ni_3Si$ layer. The thickness can be set to, for example, at least 10 nm, preferably at least 20 nm. On the other hand, in connection with miniaturization, the thickness can be set to at most 120 nm, preferably at most 100 nm.

The thickness of the low resistance layer according to the second exemplary embodiment is preferably sufficiently large while avoiding affecting the value of the effective work function, determined by the silicide making up the lower layer portion of the gate electrode. To obtain a sufficiently low resistance, the thickness of the low resistance layer can be set to, for example, at least 10 nm, preferably at least 20 nm. On the other hand, in connection with the adverse effects on the effective work function and the easiness of formation, the thickness can be set to, for example, at most 120 nm, preferably at most 100 nm. The thickness of the lower layer portion ($Ni_3Si$ electrode) of the gate electrode according to the second exemplary embodiment can be appropriately set within a range of values similar to that for the $Ni_3Si$ electrodes 8 and 9 according to the first exemplary embodiment.

For the size of the gate electrode (including the low resistance layer) according to the present invention, height (length perpendicular to the substrate) can be set to at most 200 nm, preferably at most 100 nm in connection with miniaturization. In connection with operational performance and manufacturing accuracy, the height is preferably set to at least 20 nm, more preferably at least 40 nm. Gate length can be set, for example, within a range of 10 to 100 nm.

In the present invention, the $Ni_3Si$ layer making up the gate electrode, corresponding to the $Ni_3Si$ electrode in the first and second exemplary embodiments, is a silicide layer containing an $Ni_3Si$ phase as a main crystal component. The silicide layer preferably has a composition expressed as $Ni_xSi_{1-x}$ (0.6<x<0.9), and more preferably satisfies 0.7<x<0.8.

In connection with the resistance value, the low resistance layer in the present invention, corresponding to the low resistance layer 11 in the second exemplary embodiment, is preferably a silicide layer containing an Ni monosilicide (NiSi) phase as a main crystal component. The silicide layer preferably has a composition expressed as $Ni_xSi_{1-x}$ (0.4<x<0.6), and more preferably satisfies 0.45<x<0.55.

The crystal phase of the nickel silicide is principally classified into $NiSi_2$, NiSi, $Ni_3Si_2$, $Ni_2Si$, $Ni_{31}Si_{21}$, $Ni_3Si$, and the like. A mixture of any of these components can also be formed. Thus, the average composition of the silicide making up the gate electrode may deviate from stoichiometry but desirably falls within the above-described compositional range. In order to inhibit a possible variation in element performance, the $Ni_3Si$ layer and the low resistance layer, which make up the gate electrode, are desirably made up of a single phase crystal as far as possible, and accordingly the layers have given compositions reflecting the single phase crystal.

The gate insulating film in the present invention preferably includes a silicon oxide film or a silicon oxynitride film at least in a surface portion of the gate insulating film, the surface portion being on the side of the gate electrode (at least in the uppermost layer portion), though the gate insulating film is not particularly limited provided that the threshold value can be controlled based on the impurities contained in the gate electrode. The gate insulating film may be a silicon oxide film, a silicon oxynitride film, a laminate film of a silicon oxide film and a silicon oxynitride film, or a laminate film of one of a silicon oxide film and a silicon oxynitride film that are provided in the uppermost layer portion, and another insulating film. The thickness of the gate insulating film is preferably set to as small a value as possible provided that the functions of the gate insulating film can be fulfilled. The thickness can be set to, for example, 1 to 2 nm.

A method of manufacturing the semiconductor device according to the first exemplary embodiment shown in FIG. 1 will be described below.

Figure 5:
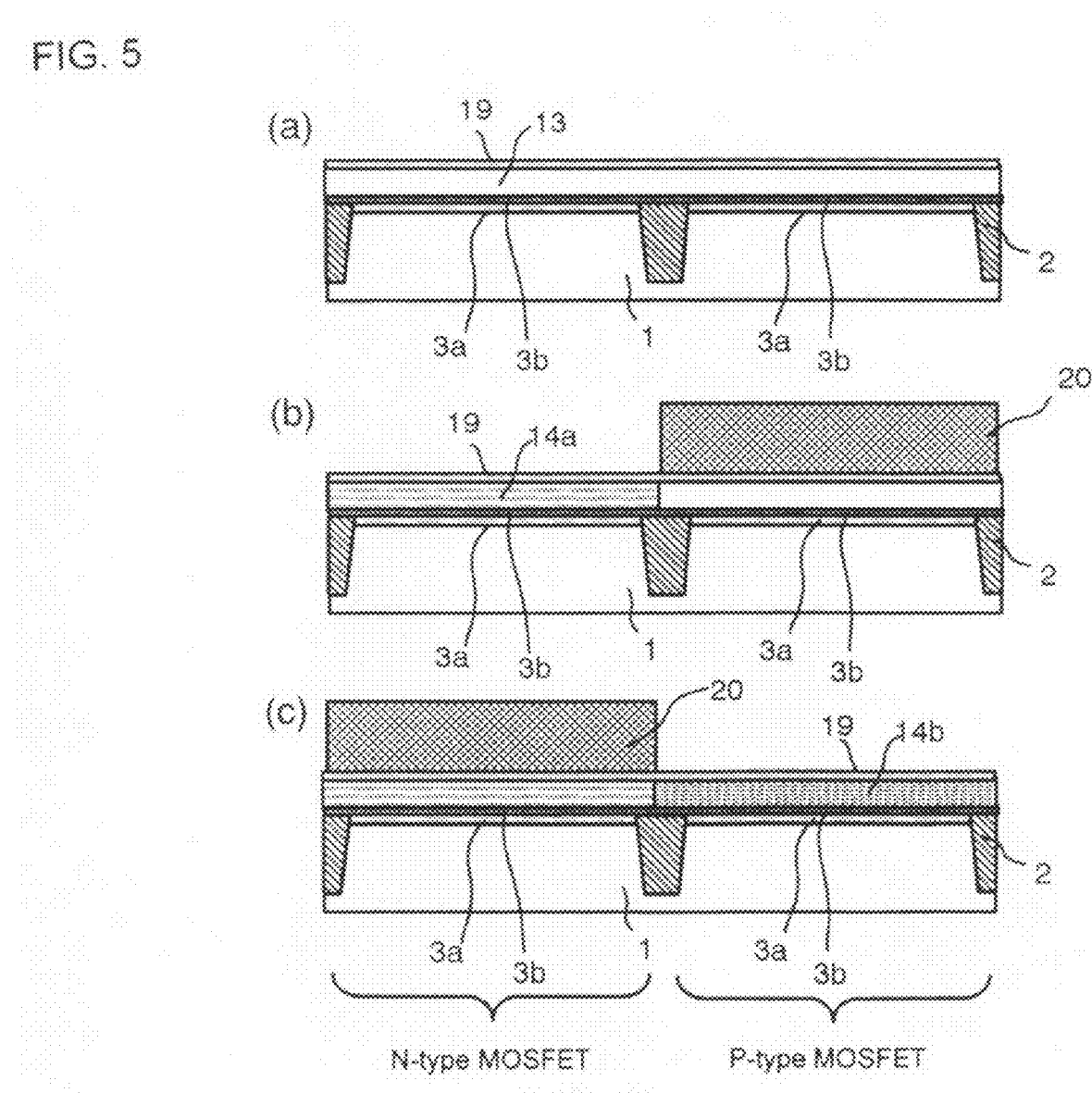
FIG. 5 is a sectional view illustrating a step of a method of manufacturing a semiconductor device (first exemplary embodiment) according to the present invention.

The silicon substrate 1 including a p-type active region, an n-type active region, and the isolation region 2, formed by an STI (Shallow Trench Isolation) technique, is prepared. Then, according to steps described below, a laminate structure shown in FIG. 5(*a*) is formed on the silicon substrate.

First, the gate insulating film 3*a* (thickness: 1.1 to 1.2 nm) is formed by thermal oxidation on the silicon substrate, in which the isolation region is formed.

Then, the adhesion layer 3*b* is formed on the gate insulating film 3*a* as follows.

According to the present method, the adhesion layer made up of hafnium silicon oxide (HfSiO) is formed by the atomic layer deposition (ALD) method. Specifically, the hafnium silicon oxide is deposited on the silicon oxide film at a substrate temperature of 200 to 500° C. using tetra diethyl amino hafnium ($Hf[(C_2H_5)_2N]_4$) and tris dimethyl amino silicon ($HSi[N(CH_3)_2]_3$) as deposition materials.

First, $H_2O$ is fed onto the silicon oxide film as an oxidation gas (first step). $H_2O$ is supplied at a flow rate 20 sccm (standard $cm^3$/min) for 50 seconds using a mass flow controller. Then, a silicon material gas is supplied at a flow rate of 2 to 20 sccm by the mass flow controller (second step). A partial pressure of the silicon material gas during deposition can be set to $1\times10^{-4}$ Torr (0.0133 Pa) to 0.3 Torr (40.0 Pa). Supply time and the temperature of the silicon material can be set to 0 to 300 seconds and 45° C., respectively. Then, an Hf material gas is fed from a container at 87° C. for 5 to 20 seconds by bubbling of a nitrogen carrier gas at a flow rate of 20 sccm (third step). At this time, the Hf material and the silicon material may be simultaneously supplied. The pressure during the deposition can be set within a range of $1\times10^{-4}$ Torr (0.0133 Pa) to 100 Torr ($1.33\times10^4$ Pa). Then, in order to oxidize the Hf and silicon element surface, $H_2O$ is supplied under the same conditions as those in the first step (fourth step). After the first to fourth steps, the second to fourth steps are repeated. For example, a cycle from the second to fourth steps can be carried out once or repeated twice to ten times. A substation step may be provided between the steps. The above-described process was carried out to form the adhesion layer on the silicon oxide film. At this time, the amount of adhesion in terms of Hf atoms was $6\times10^{13}$ cm$^{-2}$ (0.06 ML).

Also, the adhesion layer according to the present invention can be formed by the following method.

According to the present method, an adhesion layer made up of $HfO_2$ and HfSiO is formed using a physical vapor phase deposition (PVD) method. Specifically, hafnium and silicon are simultaneously deposited on the silicon oxide film (co-sputter method) and then subjected to an oxidation process. Two sputter targets for hafnium and silicon may be installed in a sputter apparatus used. With the following conditions set, that is, with sputter power set to 15 to 100 W and a distance between the target and a silicon wafer set to 240 to 330 mm, possible sputter damage to the silicon oxide film can be minimized. An Ar gas of 20 to 100 sccm is used for plasma generation. Feeding an Ar gas of 100 sccm allows a background pressure of the chamber to be kept at $1.6\times10^{13}$ Torr ($2.13\times10^{15}$ Pa). By reducing the sputter power and increasing the flow rate of Ar, a sputter rate can be reduced, and a reduced amount of elements can be deposited on the silicon oxide film. Furthermore, during deposition, the uniformity of the sputter deposition can be improved by rotating the substrate. Hf and Si were deposited on the silicon oxide film by co-sputtering, for example, for 5 seconds with the sputter power set to 15 W, the Ar flow rate set to 100 sccm, the substrate rotation speed set to 60 rpm, and the distance between the target and the silicon wafer set to 300 mm. At this time, the amount of Hf adhering was $4\times10^{13}$ cm$^{-2}$ (0.04 mL). Thereafter, the silicon wafer was exposed to an oxygen atmosphere at 800° C. at an ordinary pressure for 30 seconds to oxidize the sputter-deposited Hf and Si. Thus, the adhesion layer made up of $HfO_2$ and HfSiO was formed.

Then, a polycrystalline silicon film 13 of thickness 60 nm is deposited, by the CVD (Chemical Vapor Deposition) method, on the gate insulating film 3b with the adhesion layer 3b formed thereon. An $SiO_2$ mask 19 of thickness 15 nm made up of a silicon oxide film was then formed.

Then, as shown in FIG. 5(b), the P-type MOSFET region is covered with a resist mask 20. Phosphorous (P) ions are implanted into the polycrystalline silicon film in the N-type MOSFET region at 10 keV to form an n-type impurities-implanted polycrystalline silicon film 14a. The amount of phosphorous implanted can be set to $4\times10^{15}$ cm$^{-2}$.

Then, as shown in FIG. 5(c), the N-type MOSFET region is covered with the resist mask 20. Boron (B) ions are implanted into the polycrystalline silicon film in the P-type MOSFET region at 3 keV to form a p-type impurities-implanted polycrystalline silicon film 14b. The amount of boron implanted can be set to $4\times10^{15}$ cm$^{-2}$.

Figure 6:
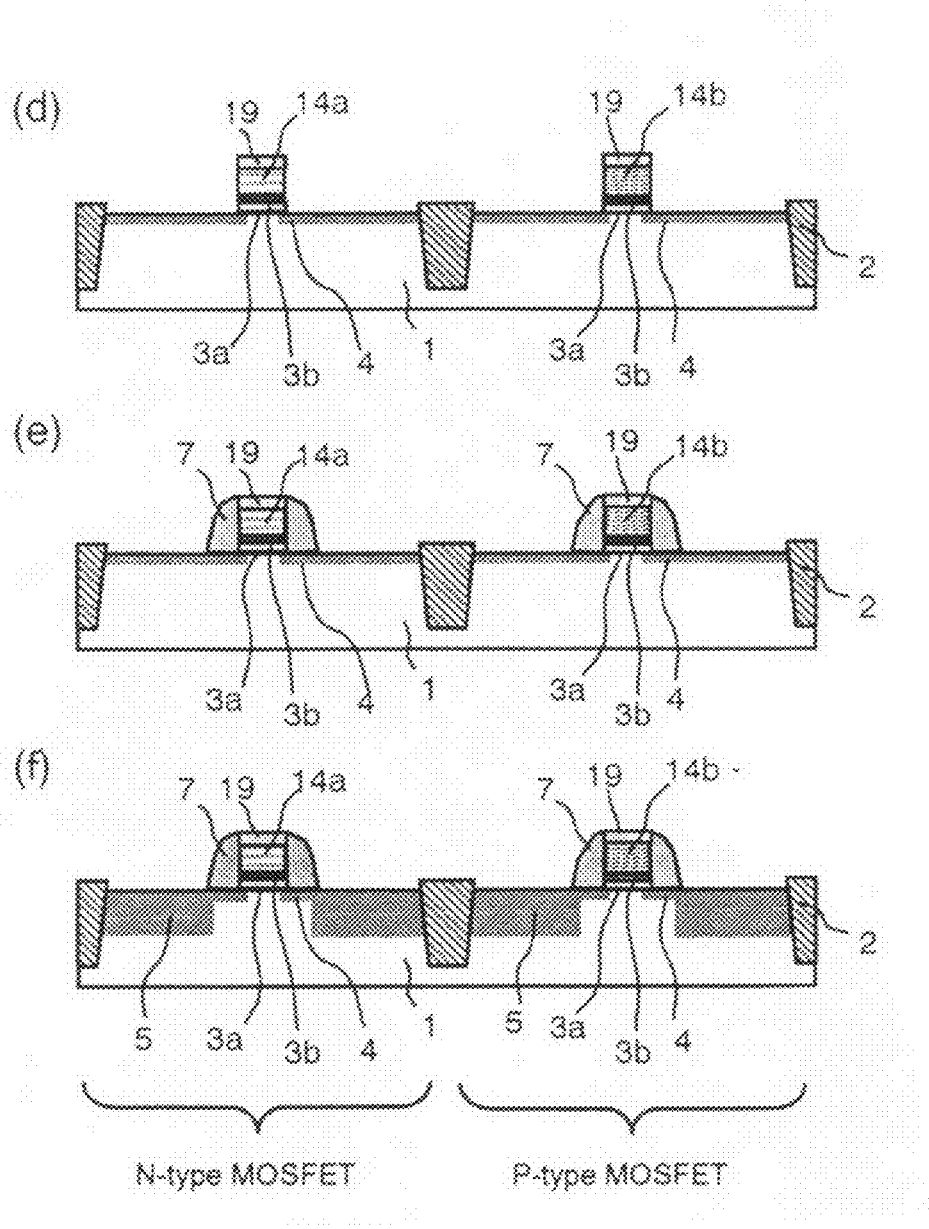
FIG. 6 is a sectional view illustrating a step of the method of manufacturing the semiconductor device (first exemplary embodiment) according to the present invention.

Then, as shown in FIG. 6(d), the laminate film (the gate insulating film 3a, the adhesion layer 3b, the impurities-implanted polycrystalline silicon films 14a and 14b, and an $SiO_2$ mask 19) is processed into a gate pattern using a lithography technique and an RIE (Reactive Ion Etching) technique. Subsequently, ions are implanted using the gate pattern as a mask to form the extension diffusion region 4 in a self-aligning manner.

Then, as shown in FIG. 6(e), a silicon nitride film (not shown in the drawings) and a silicon oxide film are deposited by the CVD method so as to cover the gate pattern. The silicon nitride film and the silicon oxide film are thereafter etched back to form the gate sidewall 7. Then, as shown in FIG. 6(f), ions are implanted again, and activation annealing is thereafter performed to form the source/drain diffusion region 5.

The extension diffusion region and the source/drain region can be formed by implanting ions of impurities of opposite conductivity types into the p- and n-type active regions with one of the active regions masked.

Figure 7:
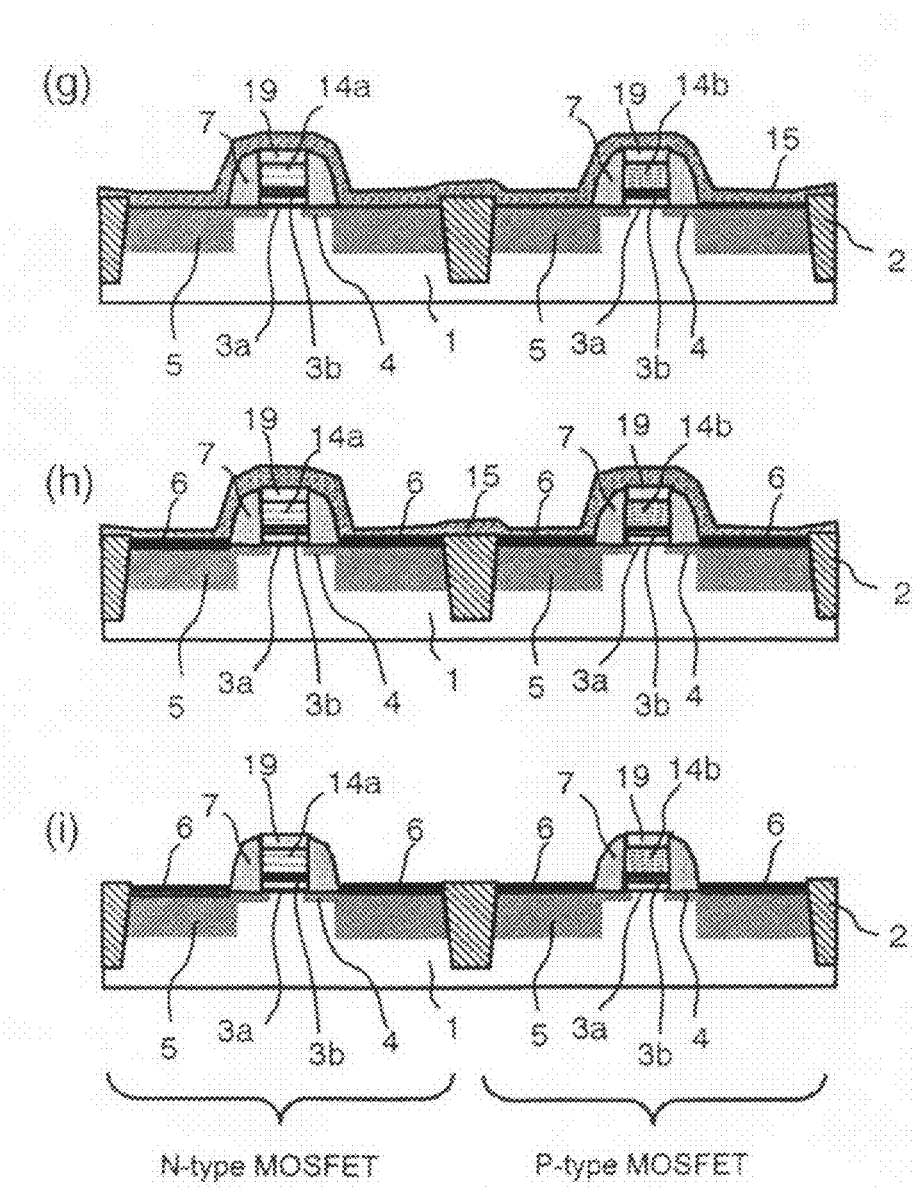
FIG. 7 is a sectional view illustrating a step of the method of manufacturing the semiconductor device (first exemplary embodiment) according to the present invention.

Then, as shown in FIG. 7(g), a nickel film 15 is deposited all over the resulting surface by sputtering. Then, as shown in FIG. 7(h), the silicide layer 6 is formed only on the source/drain diffusion region using the gate pattern, the gate sidewall and the isolation region as a mask by a salicide technique. In the present exemplary embodiment, as the silicide layer 6, an Ni monosilicide (NiSi) layer that enables contact resistance to be minimized is formed. A Co silicide layer or a Ti silicide layer may be formed instead of the Ni monosilicide layer.

Then, as shown in FIG. 7(i), surplus Ni is removed by wet etching using a mixed solution of sulfuric acid and hydrogen peroxide.

Figure 8:
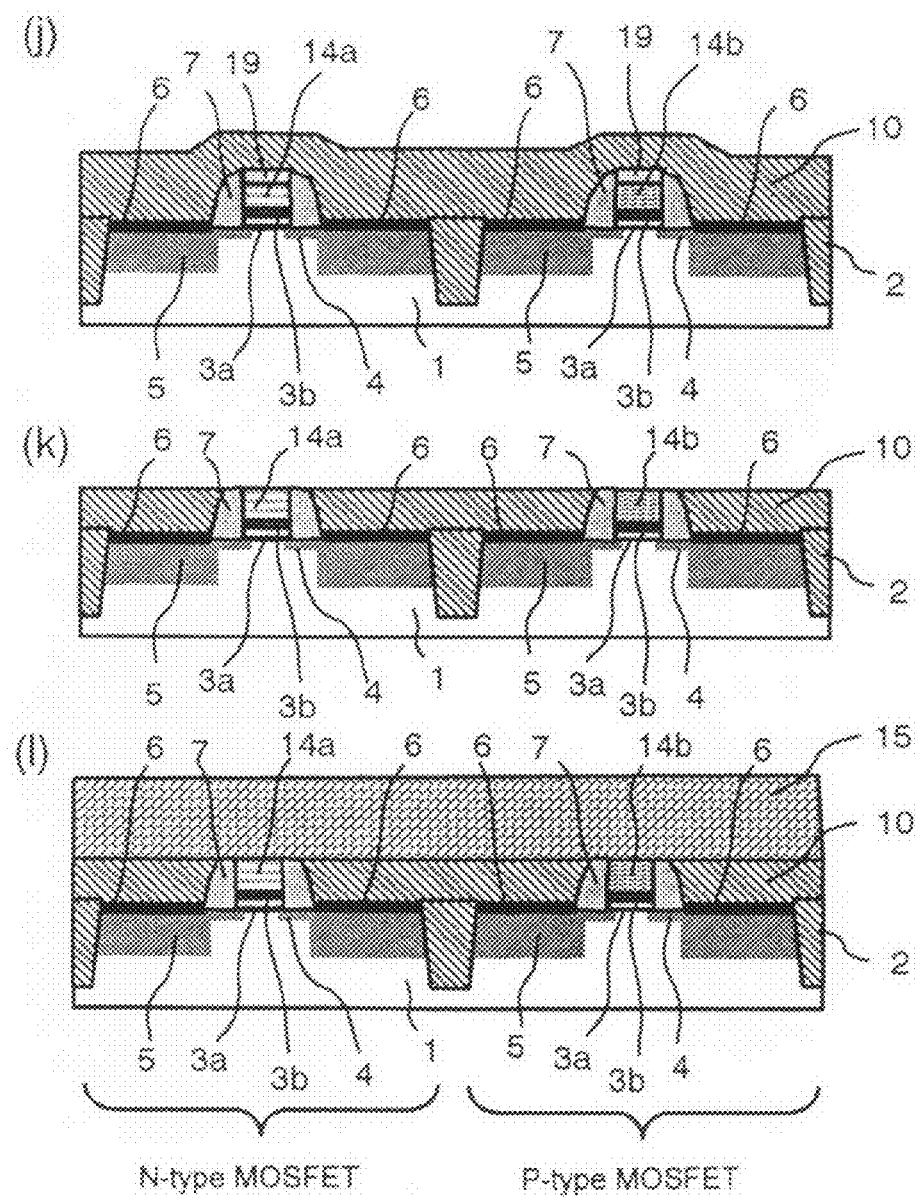
FIG. 8 is a sectional view illustrating a step of the method of manufacturing the semiconductor device (first exemplary embodiment) according to the present invention.

Then, as shown in FIG. 8(j), the interlayer insulating film 10 made up of a silicon oxide film is formed by the CVD method so as to bury the gate pattern. A surface of the interlayer insulating film 10 is then flattened by a CMP (Chemical Mechanical Polishing) technique.

Then, as shown in FIG. 8(k), the interlayer insulating film 10 is etched back, and thus the $SiO_2$ mask 19 in an upper layer of the gate pattern is removed to expose the impurities-implanted polycrystalline silicon films 14a and 14b.

Then, as shown in FIG. 8(l), the nickel film 15 (thickness: 100 nm) is formed all over the resulting surface for siliciding the impurities-implanted polycrystalline silicon films 14a and 14b.

Figure 9:
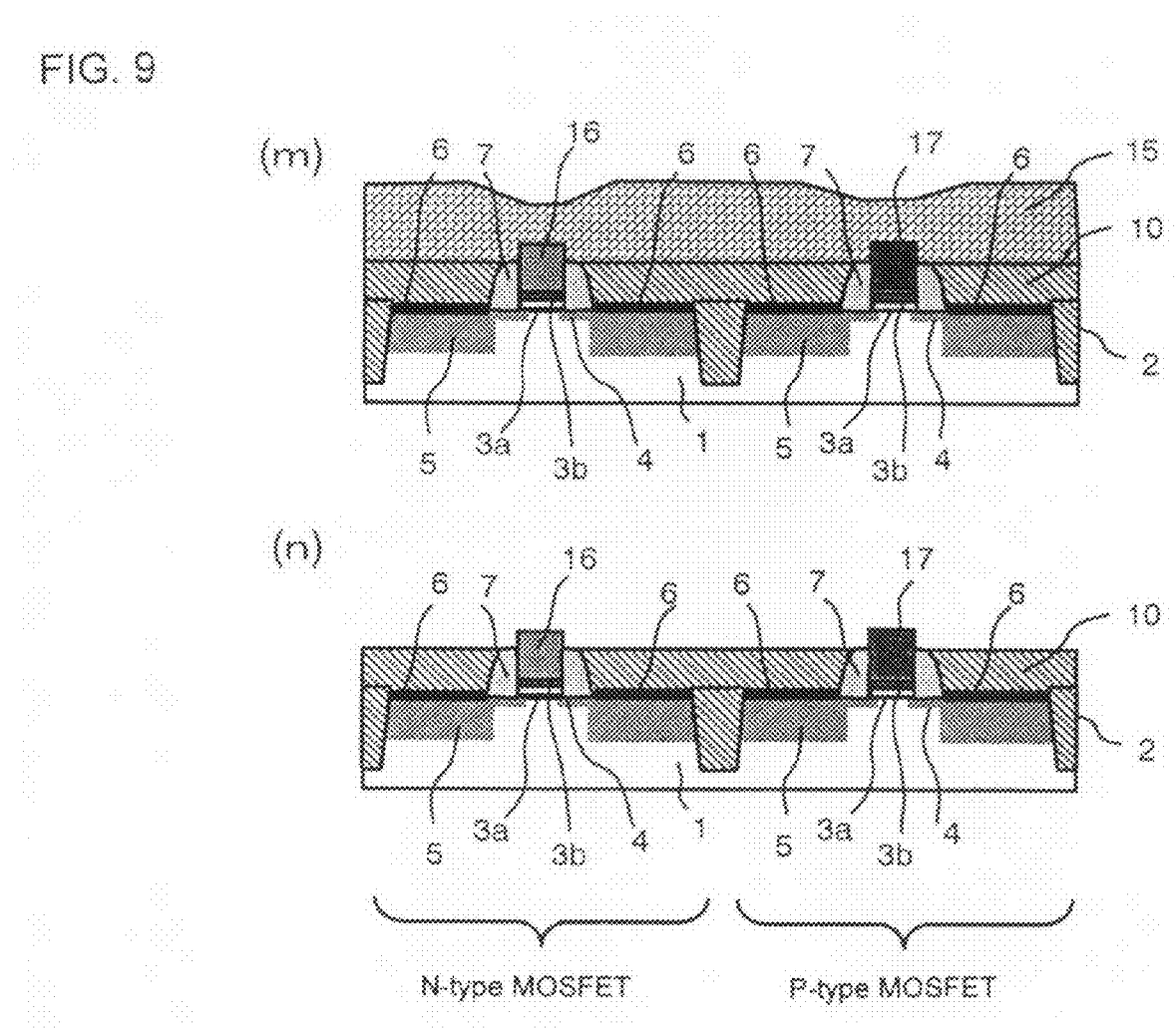
FIG. 9 is a sectional view illustrating a step of the method of manufacturing the semiconductor device (first exemplary embodiment) according to the present invention.

Then, as shown in FIG. 9(m), heat treatment is carried out to form impurities-containing $Ni_3Si$ electrodes 16 and 17. For the heat treatment conditions, for example, the temperature can be set to 400° C., and the heat treatment time can be set to 5 minutes.

Then, as shown in FIG. 9(n), surplus Ni is removed by wet etching using a mixed solution of sulfuric acid and hydrogen peroxide.

The above-described process enables formation of the structure of the first exemplary embodiment shown in FIG. 1. Thereafter, an interlayer insulating film is formed all over the resulting surface according to a normal method. A desired semiconductor device can be subsequently formed according to a normal process.

Then, a method of manufacturing the semiconductor device according to the second exemplary embodiment shown in FIG. 2 will be described.

Figure 10:
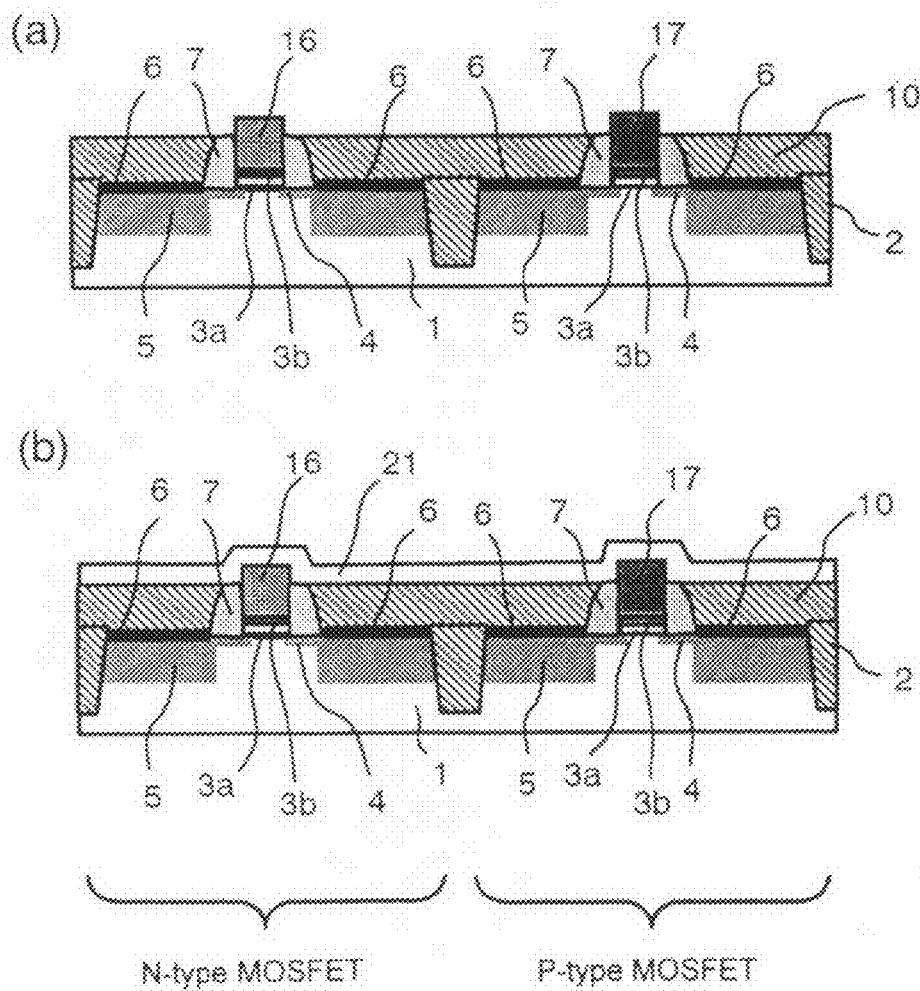
FIG. 10 is a sectional view illustrating a step of a method of manufacturing a semiconductor device (second exemplary embodiment) according to the present invention.

A structure shown in FIG. 10(a) corresponding to FIG. 9(n) is formed according to the above-described method of manufacturing the semiconductor device.

Then, as shown in FIG. 10(b), a silicon (Si) film 21 of thickness about 60 nm is formed all over the resulting surface by sputtering.

Then, as shown in FIG. 11(c), heat treatment is used to allow the Si film 21 to react with the upper layer portion of the impurities-containing Ni$_3$Si electrode 16 in the N-type MOSFET region and with the upper layer portion of the impurities-containing Ni$_3$Si electrode 17 in the P-type MOSFET region. A low resistance layer region 18 is formed in each of the N- and P-type MOSFET regions. The heat treatment conditions are desirably set such that the heat treatment is performed, for example, in an inert gas atmosphere at 350 to 500° C. for 1 to 20 minutes. The heat treatment conditions can be set such that the heat treatment is performed, for example, in a nitrogen atmosphere at 400° C. for 2 to 5 minutes.

Figure 11:
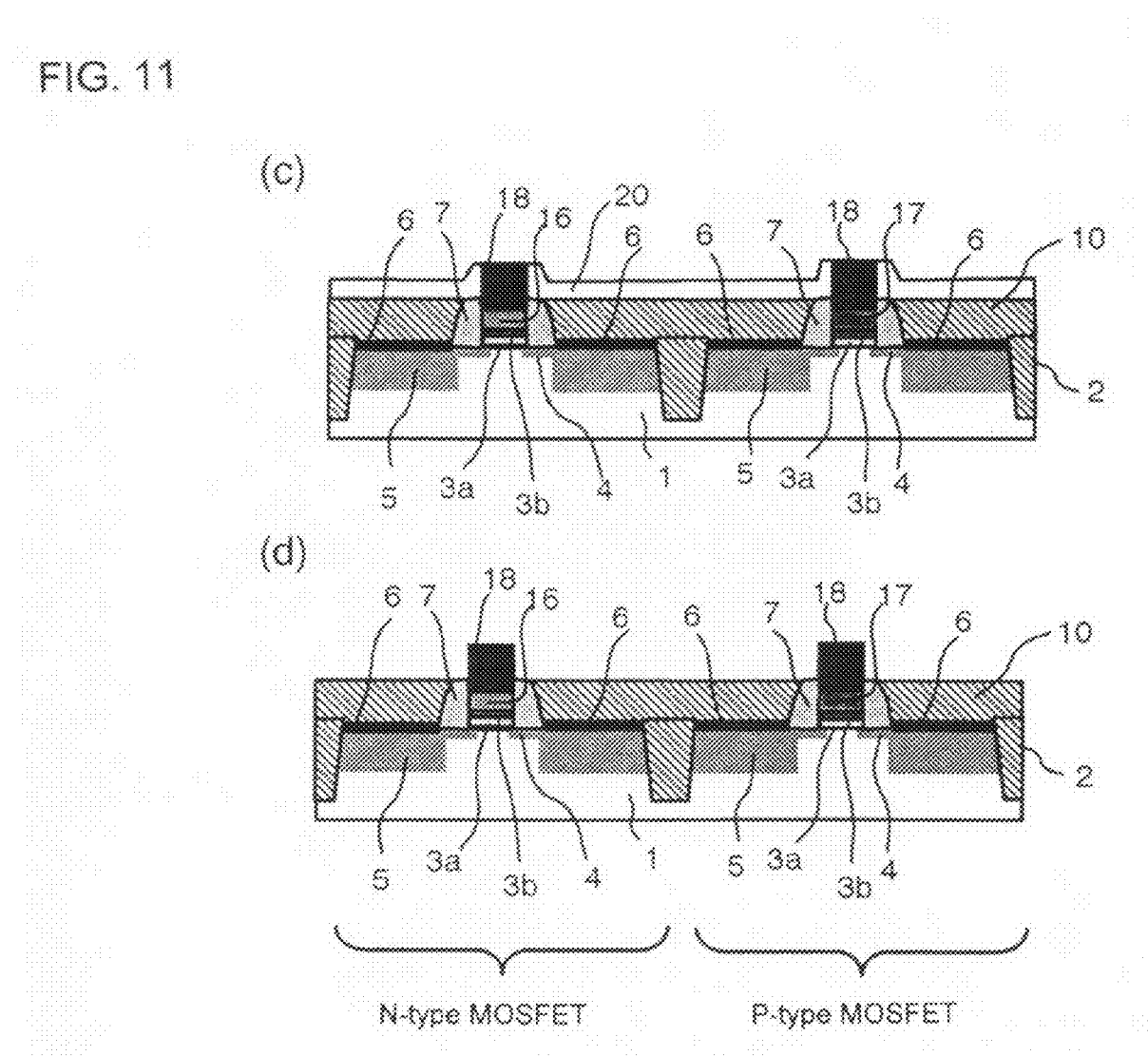
FIG. 11 is a sectional view illustrating a step of the method of manufacturing the semiconductor device (second exemplary embodiment) according to the present invention.

Then, as shown in FIG. 11(*d*), a surplus Si film is removed by wet etching or dry etching.

The above-described process enables formation of the structure of the second exemplary embodiment shown in FIG. 2. Thereafter, an interlayer insulating film is formed all over the resulting surface according to the normal method. A desired semiconductor device can be subsequently formed according to the normal process.

The invention claimed is:

1. A semiconductor device comprising:
    a silicon substrate;
    a P type channel field effect transistor comprising a first gate insulating film on the silicon substrate, a first gate electrode on the first gate insulating film, and source/drain regions formed in the substrate on opposite sides of the first gate electrode; and
    an N type channel field effect transistor including a second gate insulating film on the silicon substrate, a second gate electrode on the second gate insulating film, and source/drain regions formed in the substrate on opposite sides of the second gate electrode,
    wherein in the P type channel field effect transistor,
        the first gate insulating film comprises a silicide oxide layer or a silicon oxynitride layer at least in a portion of the first gate insulating film, the portion including an upper surface thereof,
        the first gate electrode comprises a silicide layer containing a first-conductivity-type impurity element and an Ni$_3$Si crystal phase, at least in a portion of the gate electrode, the portion including a lower surface thereof, and
        the P type channel field effect transistor comprises an adhesion layer containing a metal oxide component, between the first gate insulating film and the first gate electrode, and
    in the N type channel field effect transistor,
        the second gate insulating film comprises a silicide oxide layer or a silicon oxynitride layer at least in a portion of the second gate insulating film, the portion including an upper surface thereof,
        the second gate electrode comprises a silicide layer containing a second conductivity type impurity element and an Ni$_3$Si crystal phase, at least in a portion of the gate electrode, the portion including a lower surface thereof, and
        the N type channel field effect transistor comprises an adhesion layer containing a metal oxide component, between the second gate insulating film and the second gate electrode.

2. The semiconductor device according to claim 1, wherein the silicide layer containing the Ni$_3$Si crystal phase is formed of a silicide expressed by a composition formula Ni$_x$Si$_{1-x}$ (0.6<x<0.9).

3. The semiconductor device according to claim 1, wherein on the silicide layer containing the Ni$_3$Si crystal phase, a low resistance layer with a lower resistance than the silicide layer is provided.

4. The semiconductor device according to claim 1, wherein an oxide component of the adhesion layer comprises a metal oxide selected from the group consisting of Hf, Ta, Zr, La, Ti, Y, and Al.

5. The semiconductor device according to claim 2, wherein an oxide component of the adhesion layer is a metal oxide selected from the group consisting of Hf, Ta, Zr, La, Ti, Y, and Al.

6. The semiconductor device according to claim 2, wherein on the silicide layer containing the Ni$_3$Si crystal phase, a low resistance layer with a lower resistance than the silicide layer is provided.

7. The semiconductor device according to claim 3, wherein the low resistance layer comprises a silicide layer containing a nickel monosilicide crystal phase.

8. The semiconductor device according to claim 4, wherein as the adhesion layer, a metal oxide of 0.01 to 0.1 mL (monolayer) in terms of molecular layers is formed.

9. A method of manufacturing the semiconductor device as recited in claim 1, the method comprising:
    preparing a semiconductor substrate including a p-type active region and an n-type active region;
    forming, on the silicon substrate, a gate insulating film comprising a silicon oxide film or a silicon oxynitride film on a uppermost surface side;
    forming an adhesion layer on the gate insulating film;
    forming a polycrystalline silicon film on the gate insulating film with the adhesion layer formed thereon;
    masking the polycrystalline silicon film on one of the active regions and adding a first-conductivity-type impurity element to the polycrystalline silicon film on the other active region;
    masking the polycrystalline silicon film on the latter active region and adding a second-conductivity-type impurity element to the polycrystalline silicon film on the former active region;
    forming a cap film on the polycrystalline silicon film;
    forming a gate pattern of the polycrystalline silicon film including the cap film on an upper surface thereof;
    masking one of the active regions and forming source/drain regions in the substrate on opposite sides of the gate pattern on the other active region;
    masking the latter active region and forming source/drain regions in the substrate on opposite sides of the gate pattern on the former active region;
    forming an interlayer insulating film all over a resulting surface;
    removing a upper surface portion of the interlayer insulating film and the cap film to expose the polycrystalline silicon making up the gate pattern;
    forming a nickel film all over a resulting surface; and
    siliciding the polycrystalline silicon under the nickel film by heat treatment to form a silicide layer containing an Ni$_3$Si crystal phase.

10. The method of manufacturing the semiconductor device according to claim 9, further comprising:
    after forming the silicide layer containing the Ni$_3$Si crystal phase, forming a silicon film all over a resulting surface; and
    diffusing nickel from the silicide layer into the silicon film by heat treatment to form a low resistance silicide layer containing a nickel monosilicide crystal phase.

* * * * *